(12) United States Patent
Sakai

(10) Patent No.: US 8,611,561 B2
(45) Date of Patent: Dec. 17, 2013

(54) FIRST STAGE AUDIO AMPLIFIER WITH CLAMPING CIRCUIT

(75) Inventor: Mitsuteru Sakai, Kyoto (JP)

(73) Assignee: Rohm Co., Ltd. (JP)

( * ) Notice: Subject to any disclaimer, the term of this patent is extended or adjusted under 35 U.S.C. 154(b) by 497 days.

(21) Appl. No.: 12/910,925

(22) Filed: Oct. 25, 2010

(65) Prior Publication Data

US 2012/0039487 A1    Feb. 16, 2012

(30) Foreign Application Priority Data

Oct. 23, 2009  (JP) .................. 2009-244722
Sep. 28, 2010  (JP) .................. 2010-217750

(51) Int. Cl.
| H04R 3/00 | (2006.01) |
| H03F 99/00 | (2009.01) |
| H03F 1/02 | (2006.01) |
| H03F 3/45 | (2006.01) |
| H03F 3/14 | (2006.01) |

(52) U.S. Cl.
USPC ............. 381/111; 381/120; 330/9; 330/69; 330/307

(58) Field of Classification Search
USPC .......... 381/111–113, 116, 120; 330/9, 69, 307
See application file for complete search history.

(56) References Cited

U.S. PATENT DOCUMENTS

| 4,348,661 A * | 9/1982 | Lucchesi ................ 340/510 |
| 4,843,626 A * | 6/1989 | Werrbach ............... 381/107 |
| 8,150,073 B2 * | 4/2012 | Matsumoto et al. ..... 381/113 |
| 2003/0044027 A1 * | 3/2003 | Tsuji et al. ............. 381/104 |
| 2005/0168278 A1 * | 8/2005 | Chung ...................... 330/9 |

FOREIGN PATENT DOCUMENTS

| JP | 7-66638 A | 3/1995 |
| JP | 2001-244760 A | 9/2001 |

\* cited by examiner

*Primary Examiner* — Ahmad Matar
*Assistant Examiner* — Katherine Faley
(74) *Attorney, Agent, or Firm* — Cantor Colburn LLP

(57) ABSTRACT

An external audio signal is input to an input terminal which is connected to the first terminal of a first resistor. The first terminal of a second resistor is connected to the second terminal of the first resistor. An operational amplifier is arranged such that its inverting input terminal is connected to the second terminal of the second resistor, and a reference voltage is applied to its non-inverting input terminal. A third resistor is arranged between the output terminal and the inverting input terminal of the operational amplifier. A first diode is arranged between the second terminal of the first resistor and a power supply terminal such that its cathode is on the power supply terminal side. Furthermore, a second diode is arranged between the second terminal of the first resistor and the ground such that its cathode is on the second terminal side of the first resistor.

18 Claims, 8 Drawing Sheets

200

202

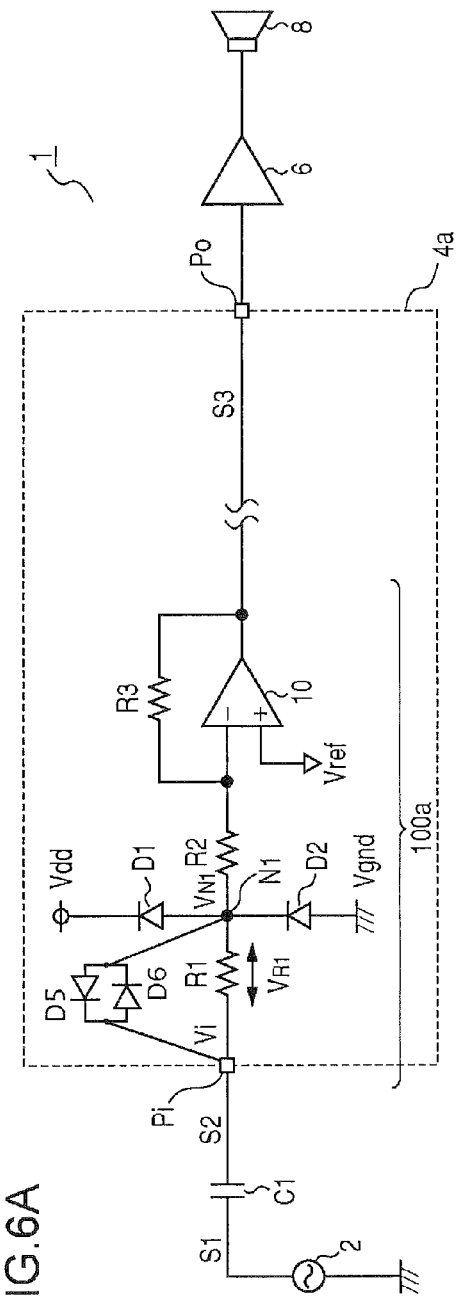
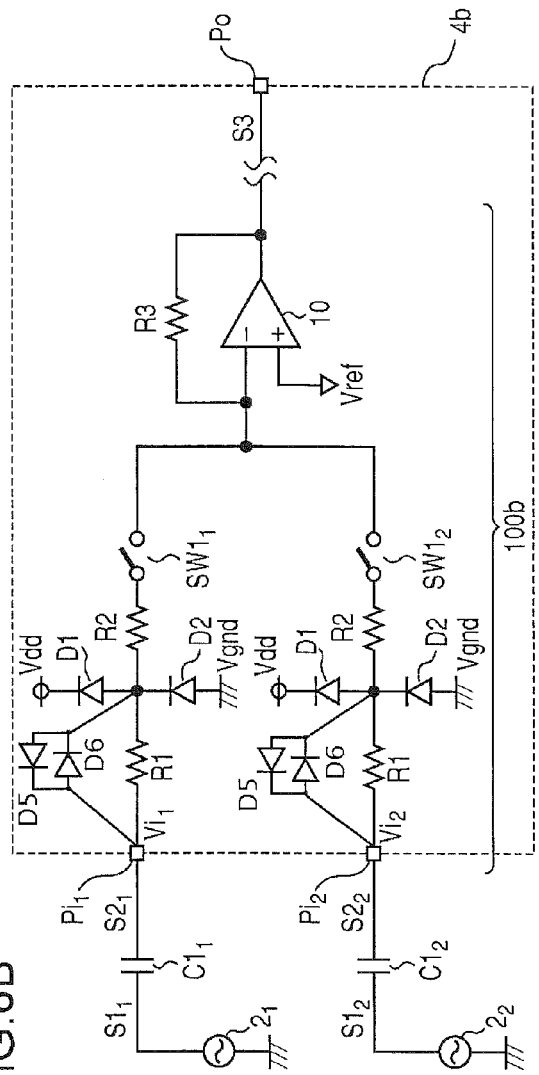
FIG.6A
FIG.6B

FIRST STAGE AUDIO AMPLIFIER WITH CLAMPING CIRCUIT

BACKGROUND OF THE INVENTION

1. Field of the Invention

The present invention relates to a first stage amplifier circuit configured to receive a signal from an external circuit of the semiconductor integrated circuit.

2. Description of the Related Art

Semiconductor integrated circuits include pads (which will be collectively referred to as "I/O pads" hereafter) which allow external signals to be received from, or signals to be output to, an external circuit. Furthermore, in many cases, semiconductor integrated circuits include a first stage amplifier circuit having a high input impedance as a first stage component connected to the I/O pads. As such a first stage amplifier circuit, a non-inverting amplifier circuit or an inverting amplifier circuit using operational amplifiers and resistors is employed.

RELATED ART DOCUMENTS

Patent Documents

[Patent Document 1]
 Japanese Patent Application Laid Open No. H07-66638
[Patent Document 2]
 Japanese Patent Application Laid Open No. 2001-244760

In a case in which the input voltage to be input to the first stage amplifier circuit swings into a high range that is beyond the power supply voltage of the semiconductor circuit, there is a need to provide, as a component upstream of the first stage amplifier circuit, a clamp circuit configured to limit the level of the input voltage to within a predetermined range. However, such a clamp circuit leads to a problem of an increased circuit area.

In a case in which such a clamp circuit is not provided, there is a need to provide, as a chip component external to the semiconductor integrated circuit, at least one resistor which is a component of the first stage amplifier circuit and which is in danger of receiving over voltage. This leads to an increased number of components or an increased circuit area. Also, this leads to increased costs. Furthermore, the gain of the first stage amplifier circuit depends on such an external resistor, leading to a problem of increased irregularities in the gain.

SUMMARY OF THE INVENTION

The present invention has been made in order to solve such a problem. Accordingly, it is an exemplary purpose of the present invention to provide a technique for reducing the circuit area of a first stage amplifier circuit.

An embodiment of the present invention relates to a first stage amplifier circuit. The first stage amplifier circuit comprises: an input terminal configured to receive an input signal from an external circuit; a first resistor arranged such that a first terminal thereof is connected to the input terminal; a second resistor arranged such that a first terminal thereof is connected to a second terminal of the first resistor; an operational amplifier arranged such that an inverting input terminal thereof is connected to a second terminal of the second resistor, and a reference voltage is applied to a non-inverting input terminal thereof; a third resistor arranged between an output terminal of the operational amplifier and the inverting input terminal of the operational amplifier; a first diode arranged between the second terminal of the first resistor and a first fixed voltage terminal such that a cathode thereof is on the first fixed voltage terminal side; and a second diode arranged between the second terminal of the first resistor and a second fixed voltage terminal such that a cathode thereof is on the second terminal side of the first resistor. The aforementioned components are integrated on a single semiconductor substrate.

Examples of combinations of the first fixed voltage terminal and the second fixed voltage terminal include: a combination of a positive power supply terminal and a ground terminal; a combination of a positive power supply terminal and a negative voltage terminal; and a combination of a negative voltage terminal and a ground terminal.

With such an embodiment, the input signal is divided by means of the first resistor and the second resistor with the reference voltage as a reference. Thus, by optimizing the division ratio, such an arrangement is capable of limiting the voltage applied to the first resistor. Thus, such an arrangement allows the first resistor to be integrated on a semiconductor substrate, thereby providing a reduced circuit area. Furthermore, with such an arrangement, the first diode and the second diode are connected to a connection node that connects the first resistor and the second resistor. Thus, such an embodiment provides the input terminal with an increased input voltage range as compared with an arrangement having a configuration in which the first diode and the second diode are directly connected to the input terminal.

Also, a first stage amplifier circuit according to an embodiment may further comprise a sixth resistor arranged between the second terminal of the fourth resistor and the first terminal of the fifth resistor. Also, the aforementioned components may be integrated on a single semiconductor substrate.

With such an embodiment, the input signal is divided by means of the fourth resistor and a combined resistor obtained by combining the fifth resistor and the sixth resistor with the reference voltage as a reference. Thus, by optimizing the division ratio, such an embodiment is capable of limiting the voltage applied to the fourth resistor. Thus, such an arrangement allows the fourth resistor to be integrated on a semiconductor substrate, thereby providing a reduced circuit area. Furthermore, with such an arrangement, the third diode and the fourth diode are connected to a connection node that connects the fifth resistor and the sixth resistor. Thus, such an arrangement provides an increased voltage range of the input terminal as compared with an arrangement having a configuration in which the third diode and the fourth diode are directly connected to the input terminal.

Another embodiment of the present invention also relates to a first stage amplifier circuit. The first stage amplifier circuit comprises: a first input terminal configured to receive, as an input signal, one side of a differential signal received from an external circuit; a second input terminal configured to receive, as an input signal, the other side of the differential signal received from the external circuit; a first resistor arranged such that a first terminal thereof is connected to the first input terminal; a second resistor arranged such that a first terminal thereof is connected to a second terminal of the first resistor; an operational amplifier arranged such that an inverting input terminal thereof is connected to a second terminal of the second resistor; a third resistor arranged between an output terminal of the operational amplifier and the inverting input terminal of the operational amplifier; a fourth resistor arranged such that a first terminal thereof is connected to the second input terminal; a fifth resistor arranged such that a first terminal thereof is connected to a second terminal of the fourth resistor and a non-inverting input terminal of the operational amplifier, and a reference voltage is applied to a second terminal thereof; a first diode arranged between the second terminal of the first resistor and a first fixed voltage terminal such that a cathode thereof is on the first fixed voltage terminal side; a second diode arranged between the second terminal of the first resistor and a second fixed voltage terminal such that a cathode thereof is on the second terminal side of the first resistor; a third diode arranged between the second terminal of the fourth resistor and the first fixed voltage terminal such that a cathode thereof is on the first fixed voltage terminal side; and a fourth diode arranged between the second terminal of the fourth resistor and the second fixed voltage terminal such that a cathode thereof is on the second terminal side of the fourth resistor. The aforementioned components are integrated on a single semiconductor substrate.

Also, the first stage amplifier circuit may further comprise a sixth resistor arranged between the second terminal of the fourth resistor and the first terminal of the fifth resistor. Also, the aforementioned components may be integrated on a single semiconductor substrate.

Yet another embodiment of the present invention relates to an electronic device. The electronic device comprises: a sound source configured to generate an audio signal; a capacitor arranged on a path of the audio signal; a first stage amplifier circuit according to any one of the aforementioned embodiments, configured to amplify the audio signal input via the capacitor; and an audio output unit configured to output the audio signal amplified by the first stage amplifier circuit.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 6A and 6B are circuit diagrams showing modifications of the first stage amplifier circuits shown in FIGS. 1A and 1B;

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B.

Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

[First Embodiment]

Figure 1A:
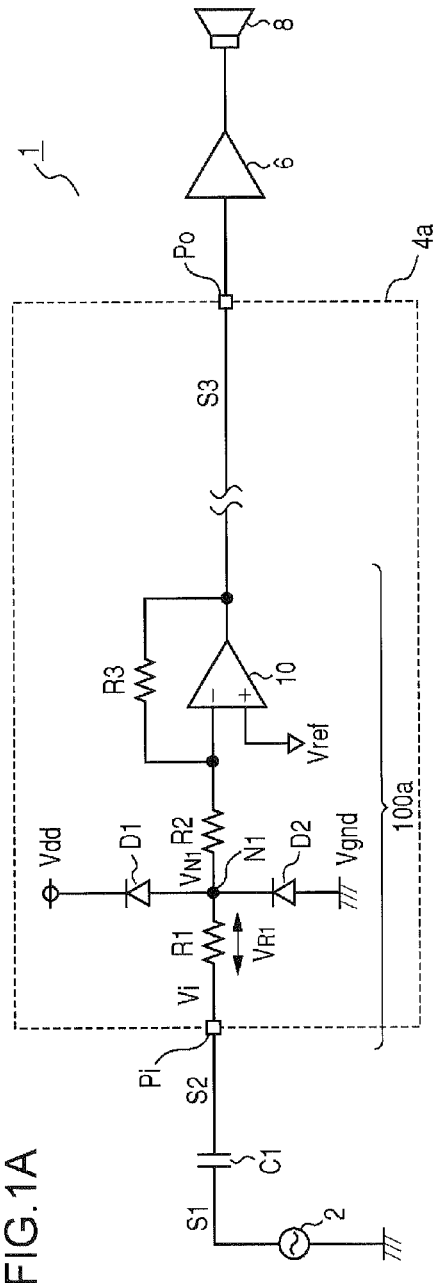
FIGS. 1A and 1B are diagrams each showing a configuration of an electronic device including a first stage amplifier circuit according to a first embodiment.
Figure 1B:
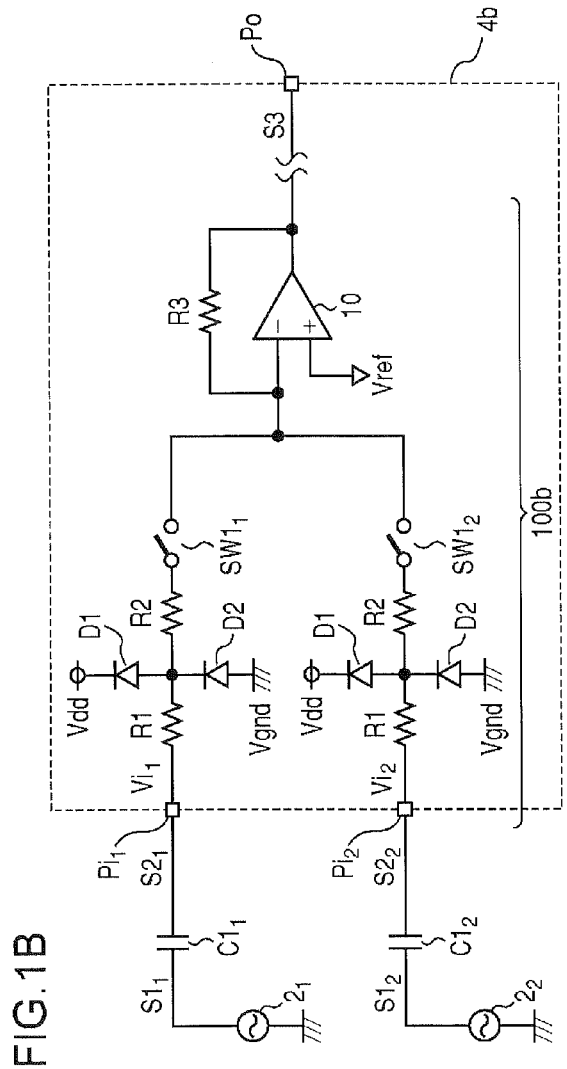

FIGS. 1A and 1B are diagrams showing a configuration of an electronic device including a first stage amplifier circuit according to a first embodiment.

An electronic device 1 is a device including a function of outputting sound, such as audio amplifiers, car stereo systems, portable audio players, cellular phone terminals, etc. The electronic device 1 includes a sound source 2, a signal processing circuit 4, a main amplifier 6, and an electroacoustic transducer 8.

The sound source 2 converts audio data, which is stored in disk media, memory, or a hard disk, or which is input from an external circuit via wired transmission or wireless transmission, into an analog audio signal S1.

An audio signal S1 supplied from the sound source 2 is input to an input terminal Pi of a signal processing unit 4a via a coupling capacitor C1. The coupling capacitor C1 removes the DC component of the audio signal S1. The signal processing circuit 4a performs predetermined audio signal processing on an audio signal S2, and outputs the resulting signal via an output terminal Po. For example, the signal processing circuit 4a performs volume adjustment of an audio signal, equalizing processing, etc.

The main amplifier 6 amplifies an audio signal S3 output from the signal processing circuit 4a so as to drive the electroacoustic transducer 8. The electroacoustic transducer 8 is configured as a speaker or headphones. Alternatively, in some cases, a line out terminal is provided instead of the electroacoustic transducer 8. Also, the main amplifier 6 may be integrated in the signal processing circuit 4a. The main amplifier 6 and the electroacoustic transducer 8 will also be referred to as the "audio output unit".

The above is the overall configuration of the electronic device 1. Next, description will be made regarding the configuration of the signal processing circuit 4a.

The signal processing circuit 4a includes a first stage amplifier circuit 100a as a first stage component thereof. The first stage amplifier circuit 100a amplifies the audio signal S1. The first stage amplifier circuit 100a is also treated as an input buffer of the signal processing circuit 4a. As downstream components of the first stage amplifier circuit 100a, an equalizer circuit, a volume circuit, and so on (not shown) are arranged, which are not shown.

The first stage amplifier circuit 100a includes an input terminal Pi, a first resistor R1, a second resistor R2, a third resistor R3, a first protection diode (which will also be referred to simply as the "diode") D1, a second diode D2, and an operational amplifier 10, which are monolithically integrated on a single semiconductor substrate together with downstream circuits.

An audio signal S2 (which will also be referred to as the "input signal" hereafter) is input to the input terminal Pi from an external circuit. The first resistor R1 is arranged such that the first terminal thereof is connected to the input terminal Pi. The first terminal of the second resistor R2 is connected to the second terminal of the first resistor R1. The inverting input terminal (−) of the operational amplifier 10 is connected to the second terminal of the second resistor R2, and a reference voltage Vref is applied to the non-inverting input terminal (+) thereof. The third resistor R3 is arranged between the output terminal of the operational amplifier 10 and the inverting input terminal (−) thereof. The reference voltage Vref is set to half the power supply voltage Vdd, for example.

The first diode D1 is arranged between the second terminal of the first resistor R1 and the first fixed voltage terminal (power supply terminal Vdd) such that the cathode thereof is on the power supply terminal Vdd side. Furthermore, the second diode D2 is arranged between the second terminal of the first resistor R1 and the second fixed voltage terminal (ground terminal Vgnd) such that the cathode is on the second terminal side of the first resistor R1.

The above is the configuration of the first stage amplifier circuit 100a. Next, description will be made regarding the operation thereof.

The first stage amplifier circuit 100a is a so-called inverting amplifier, and is configured to amplify the input signal S2 with a gain g. The gain g of the AC component of the input signal S2 is represented by the Expression $g=-R3/(R1+R2)$.

If the voltage Vi at the input terminal Pi exceeds the reverse voltage (Zener voltage) Vz of the second diode D2 due to positive high-voltage surge noise applied to the input terminal Pi, the second diode D2 turns on in the reverse direction, thereby protecting downstream components of the second resistor R2. Conversely, if the voltage difference (Vdd−Vi) between the power supply terminal Vdd and the input terminal Pi exceeds the reverse voltage Vz of the first diode D1 due to negative high-voltage surge noise applied to the input terminal Pi, the first diode D1 is turned on in the reverse direction, thereby protecting the downstream components of the second resistor R2.

Furthermore, the first diode D1 and the second diode D2 function as a clamp circuit configured to clamp (clip) the voltage input to the first stage amplifier circuit 100a to a predetermined level. With respect to such a function, the first stage amplifier circuit 100a has the advantages described below. These advantages are clearly understood in comparison with conventional techniques shown in FIG. 2A. Accordingly, first, description will be made regarding the comparison technique.

Figure 2A:
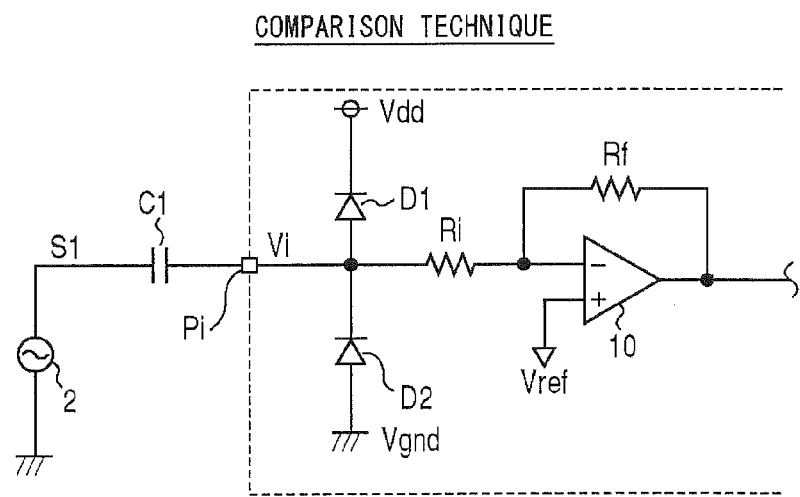
FIGS. 2A and 2B are circuit diagrams each showing an example configuration of a first stage amplifier circuit according to a comparison technique.
Figure 2B:
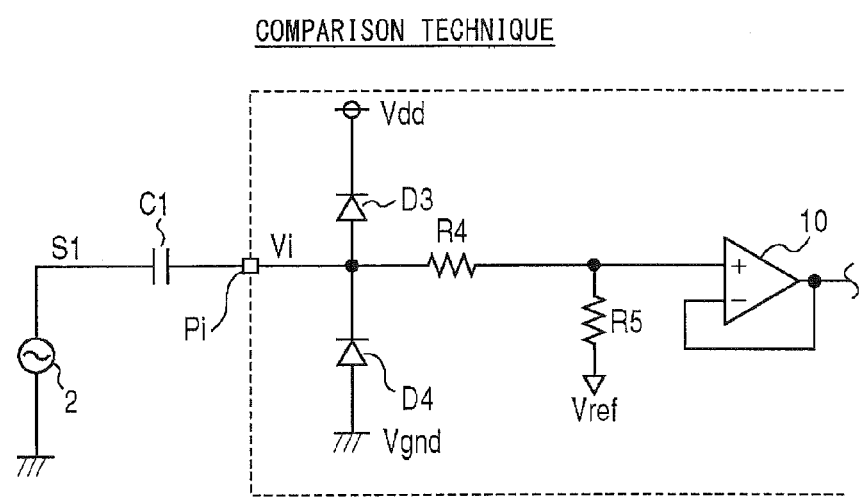

FIGS. 2A and 2B are circuit diagrams showing example configurations of first stage amplifier circuits 200 and 202 according to the comparison technique. With the first stage amplifier circuit 200 shown in FIG. 2A, the first diode D1 and the second diode D2 are directly connected to the input terminal (input pad) Pi. With such an arrangement, the input resistor Ri is included in a semiconductor integrated circuit as a built-in component. The first stage amplifier circuit 200 is configured as an inverting amplifier circuit comprising an input resistor Ri, a feedback resistor Rf, and an operational amplifier 10.

The voltage Vi at the input terminal Pi is clipped by the first diode D1 such that it does not exceed Vdd+Vf, and is clipped by the first diode D2 such that it does not exceed −Vf. The voltage Vf is the forward voltage of the first diode D1, and is also that of the second diode D2. Typically, the forward voltage Vf is on the order of 0.7 V. That is to say, the voltage Vi at the input terminal Pi is limited to a range between −Vf and Vdd+Vf. Where the power supply voltage for the signal processing circuit 4 is set to 3 V, the voltage Vi at the input terminal Pi is limited to a range between 0.7 V and 3.7 V.

On the other hand, the maximum amplitude of the audio signal S2 is taken to be 2 Vrms (i.e., 2.8 V peak to zero). In this case, the voltage Vi at the input terminal Pi swings in a range of ±2.8 V from Vref=1.5 V as the center point. Accordingly, the voltage range is between −1.3 V and 4.3 V. That is to say, a problem arises in such an arrangement in that the input voltage Vi is clipped by the first diode D1 and the second diode D2.

Figure 3:
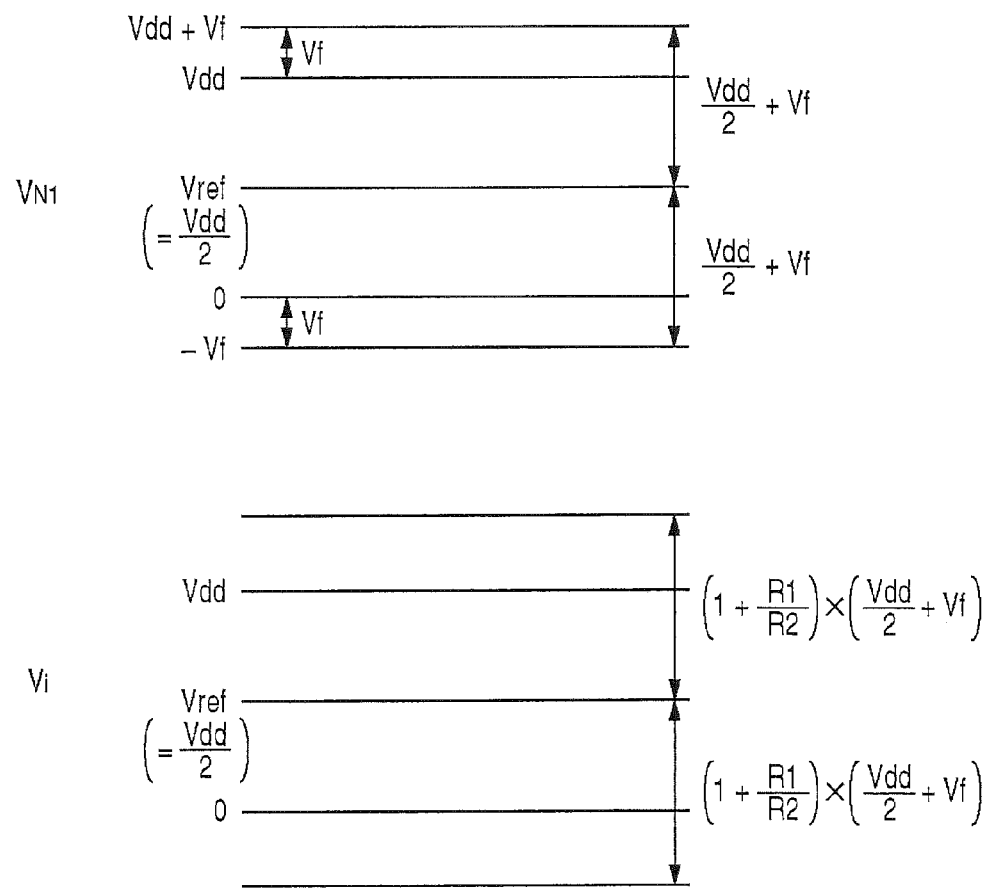
FIG. 3 is a level diagram showing the signals in the first stage amplifier circuit shown in FIG. 1A.

The first stage amplifier circuit 100a shown in FIG. 1A solves such a problem. FIG. 3 is a level diagram showing the signals of the first stage amplifier circuit 100a shown in FIG. 1A.

In FIG. 1A, the voltage VN1 at the connection node N1 that connects the first resistor R1 and the second resistor R2 is clipped by the first diode D1 such that it does not exceed Vdd+Vf. Furthermore, the voltage VN1 is clipped by the second diode D2 such that it does not become −Vf or less. That is to say, such an arrangement allows the voltage VN1 to swing in a range between ±(Vdd/2+Vf) from the reference voltage Vref (=Vdd/2) as the center point.

With the circuit shown in FIG. 1, because the operational amplifier 10 is configured with a virtual short, the voltage at the inverting input terminal of the operational amplifier 10 can be assumed to be equal to Vref (=1.5 V). The voltage VN1 at the connection node N1 is a voltage obtained by dividing the voltage difference between the voltage Vi at the input terminal Pi and the voltage Vref at the inverting input terminal of the operational amplifier 10. To state the converse of this, such an arrangement allows the voltage VN1 at the connection node N1 to swing in a range between ±(Vdd/2+Vf) from the reference voltage Vref as the center point. Thus, such an arrangement allows the voltage Vi at the input terminal Pi to swing in a range between ±(1+R1/R2)×(Vdd/2+Vf) from the reference voltage Vref as the center point.

That is to say, such an arrangement provides an increased input voltage range as compared with the first stage amplifier circuit 200 shown in FIG. 2A. In other words, such an arrangement allows the input voltage range to be adjusted according to the division ratio provided by the first resistor R1 and the second resistor R2. More specifically, the division ratio obtained by the first resistor R1 and the second resistor R2 should be determined such that the normal input signal S2 is not clamped.

With conventional techniques, in order to limit the input voltage range, there is a need to provide a clamp circuit as an additional component, in addition to the protection diodes. In contrast, with the first stage amplifier circuit 100a shown in FIG. 1A, the protection diodes D1 and D2 function as a clamp circuit together with the first resistor R1 and the second resistor R2. Thus, such an arrangement provides a reduced circuit area.

The above are the operations and the advantages of the first stage amplifier circuit 100a shown in FIG. 1A.

FIG. 1B is a circuit diagram which shows a first stage amplifier circuit 100b according to a modification of an arrangement shown in FIG. 1A. A signal processing circuit 4b receives audio signals S11 and S12 from multiple sound sources 21 and 22 via input terminals Pi1 and Pi2, selects one of the input signals thus received, performs signal processing on the input signal thus selected, and outputs the resulting signal via an output terminal Po. The number of sound sources may be determined as desired, as can be readily conceived by those skilled in this art. Each subscript number denotes an identification number that corresponds to a corresponding sound source. However, these subscript numbers are omitted when there is no need to identify a particular sound source.

Description will be made regarding the configuration of the first stage amplifier circuit 100b shown in FIG. 1B, focusing on how it differs from the configuration shown in FIG. 1A. With the first stage amplifier circuit 100b, an operational amplifier 10a and a third resistor R3 are shared by the multiple input terminals, and a first diode D1, a second diode D2, a first resistor R1, and a second resistor R2 are provided for each input terminal. The second terminal of the second resistor R2 provided to each of the input terminals Pi is connected to the inverting input terminal of the operational amplifier 10 via the switch SW1. With the first stage amplifier circuit 100b shown in FIG. 1B, the same operation shown in FIG. 1A is provided by turning on the switch SW1 that corresponds to the sound source 2 to be reproduced. Thus, such an arrangement provides the same advantage.

[Second Embodiment]

Figure 4A:
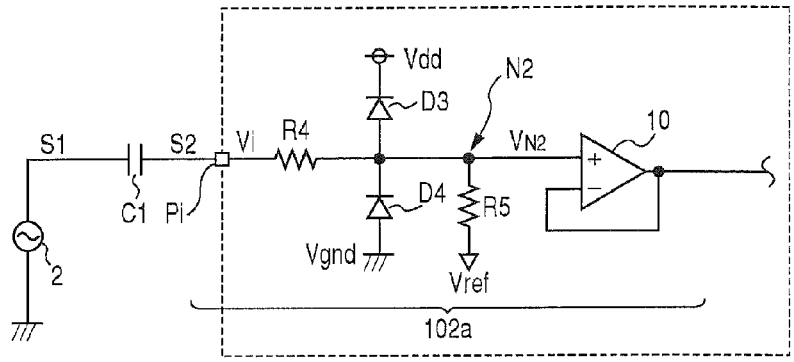
FIG. 4A through FIG. 4C are circuit diagrams each showing a configuration of a first stage amplifier circuit according to a second embodiment.
Figure 4B:
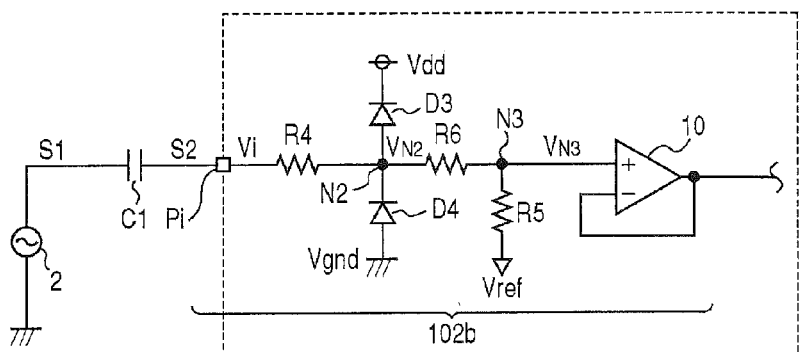
Figure 4C:
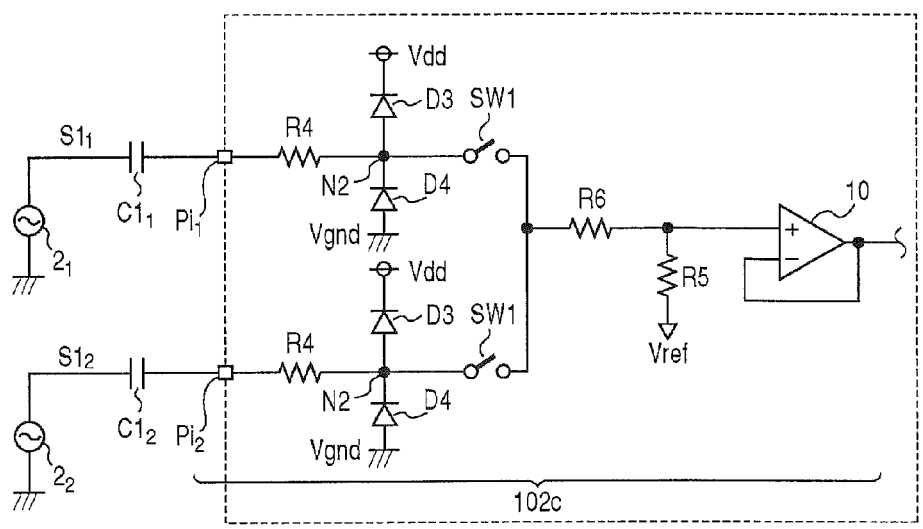

FIGS. 4A through 4C are circuit diagrams showing the configurations of first stage amplifier circuits 102a through 102c according to the second embodiment. Description of features that are the same as those in the first embodiment will be omitted. Description will be made regarding the characteristic features of the configuration of the second embodiment.

Referring to FIG. 4A, the first stage amplifier circuit 102 includes a first input terminal Pi, a fourth resistor R4, a fifth resistor R5, a third diode D3, a fourth diode D4, and an operational amplifier 10, which are monolithically integrated on a single semiconductor substrate together with the downstream circuit.

The first terminal of the fourth resistor R4 is connected to the input terminal Pi. The first terminal of the fifth resistor R5 is connected to the second terminal of the fourth resistor R4 and the reference voltage Vref is applied to the second terminal thereof. The reference voltage Vref is set to be half the power supply voltage Vdd.

The non-inverting terminal of the operational amplifier 10 is connected to the first terminal of the fifth resistor R5. Furthermore, the non-inverting input terminal of the operational amplifier 10 is connected to the output terminal thereof. The operational amplifier 10 is configured as a so-called voltage follower, and outputs, without change, the voltage VN2 at the connection node N2 that connects the fourth resistor R4 and the fifth resistor R5.

The third diode D3 is arranged between the second terminal of the fourth resistor R4 (i.e., connection node N2) and the power supply terminal Vdd such that the cathode thereof is on the power supply terminal Vdd side. That is to say, the anode of the third diode D3 is connected to the connection node N2.

Furthermore, the fourth diode D4 is arranged between the second terminal of the fourth resistor R4 (i.e., the connection node N2) and the ground terminal Vgnd such that the cathode thereof is on the second terminal side of the fourth resistor R4.

The above is the configuration of the first stage amplifier circuit 102a. Next, description will be made regarding the operation thereof. The first stage amplifier circuit 102a performs non-inverting amplification of the input signal S2 with a gain g. The gain g for the AC component of the input signal S2 is represented by the Expression g=R5/(R4+R5).

If the voltage Vi at the input terminal Pi exceeds the reverse voltage Vz of the fourth diode D4 due to positive high-voltage surge noise applied to the input terminal Pi, the fourth diode D4 turns on in the reverse direction, thereby protecting downstream components of the fourth resistor R4. Conversely, if the voltage difference (Vdd−Vi) between the power supply terminal Vdd and the input terminal Pi exceeds the reverse voltage Vz of the third diode D3 due to negative high-voltage surge noise applied to the input terminal Pi, the third diode D3 is turned on in the reverse direction, thereby protecting the downstream components of the fourth resistor R4.

Furthermore, the third diode D3 and the fourth diode D4 function as a clamp circuit configured to clamp (clip) the voltage input to the first stage amplifier circuit 102a to a predetermined level. With respect to such a function, the first stage amplifier circuit 102a has the advantages described below. These advantages are clearly understood in comparison with conventional techniques shown in FIG. 2B. Accordingly, first, description will be made regarding the comparison technique.

With the first stage amplifier circuit 202 shown in FIG. 2B, the third diode D3 and the fourth diode D4 are each directly connected to the input terminal (input pad) Pi. With such an arrangement, the input resistor R4 is built into the semiconductor integrated circuit.

The voltage Vi at the input terminal Pi is clipped by the third diode D3 such that it does not exceed Vdd+Vf, and is clipped by the fourth diode D4 such that it does not become −Vf or less. That is to say, the voltage Vi at the input terminal Pi is limited in a range between −Vf and Vdd+Vf. That is to say, as shown in FIG. 2A, such an arrangement leads to a problem in that the input voltage Vi is clipped by the third diode D3 and the fourth diode D4.

The first stage amplifier circuit 102a shown in FIG. 4A solves such a problem.

In FIG. 4A, the voltage VN2 at the connection node N2 that connects the fourth resistor R4 and the fifth resistor R5 is clipped by the third diode D3 such that it does not exceed Vdd+Vf. Furthermore, the voltage VN2 is clipped by the fourth diode D4 such that it does not become −Vf or less. That is to say, such an arrangement allows the voltage VN2 to swing in a range between ±(Vdd/2+Vf) from the reference voltage Vref (=Vdd/2) as the center point.

The voltage VN2 at the connection node N2 is a voltage obtained by dividing the voltage difference between the voltage Vi at the input terminal Pi and the reference voltage Vref. To state the converse of this, such an arrangement allows the voltage VN2 at the connection node N2 to swing in a range between ±(Vdd/2+Vf) from the reference voltage Vref as the center point. Thus, such an arrangement allows the voltage Vi at the input terminal Pi to swing in a range between ±(R4+R5)/R5×(Vdd/2+Vf) from the reference voltage Vref as the center point.

That is to say, such an arrangement provides an increased input voltage range as compared with the first stage amplifier circuit 202 shown in FIG. 2B. In other words, such an arrangement allows the input voltage range to be adjusted according to the division ratio provided by the fourth resistor R4 and the fifth resistor R5. More specifically, the division ratio obtained by the fourth resistor R4 and the fifth resistor R5 should be determined such that the normal input signal S2 is not clamped.

With conventional techniques, in order to limit the input voltage range, there is a need to provide a clamp circuit as an additional component, in addition to the protection diodes. In contrast, with the first stage amplifier circuit 102a shown in FIG. 4A, the protection diodes D3 and D4 function as a clamp circuit together with the fourth resistor R4 and the fifth resistor R5. Thus, such an arrangement provides a reduced circuit area.

Furthermore, with the first stage amplifier circuit 102a shown in FIG. 4A, unlike an arrangement shown in FIG. 2, the input resistor Ri is not connected in the form of an external component, thereby providing a reduced circuit area.

The above are the operations and the advantages of the first stage amplifier circuit 102a shown in FIG. 4A. FIG. 4B is a circuit diagram which shows a modification of the first stage amplifier circuit 102a shown in FIG. 4A. A first stage amplifier circuit 102b further includes a sixth resistor R6 in addition to the components of the first stage amplifier circuit 102a shown in FIG. 4A. The sixth resistor R6 is arranged between the second terminal (N2) of the fourth resistor R4 and the first terminal of the fifth resistor R5. The operational amplifier 10 outputs, as an output signal, the voltage VN3 at the connection node N3 that connects the fifth resistor R5 and the sixth resistor R6.

The gain g of the first stage amplifier circuit 102b shown in FIG. 4B is represented by the Expression g=R5/(R4+R5+R6). Furthermore, such an arrangement allows the voltage VN2 at the connection node N2 to swing in a range between ±(Vdd/2+Vf) from the reference voltage Vref as the center point. Thus, such an arrangement allows the voltage Vi at the input terminal Pi to swing between ±(R4+R5+R6)/(R5+R6)×(Vdd/2+Vf).

An arrangement shown in FIG. 4A has a problem in that the gain g of the first stage amplifier circuit 102a and the input voltage range cannot be determined independently. In contrast, the first stage amplifier circuit 102b shown in FIG. 4B allows the gain g and the input voltage range to be set independently.

FIG. 4C is a circuit diagram which shows a modification of the first stage amplifier circuit 102b shown in FIG. 4B. A first stage amplifier circuit 102c shown in FIG. 4C receives audio signals S11 and S12 from multiple sound sources 21 and 22 via input terminals Pi1 and Pit. The first stage amplifier circuit 102c selects either one of the signals, performs signal processing on the signal thus selected, and outputs the resulting signal via the output terminal Po.

With the first stage amplifier circuit 102c, a set of the operational amplifier 10, the fifth resistor R5, and the sixth resistor R6 is provided as a component shared by the multiple input terminals. On the other hand, a set of the third diode D3, the fourth diode D4, and the fourth resistor R4 is provided for each input terminal. The second terminals (N2) of the fourth resistors R4 provided in increments of the input terminals Pi are connected to the sixth resistor R6 via the switches SW1.

With the first stage amplifier circuit 102c shown in FIG. 4C, the same operation shown in FIG. 4B is provided by turning on the switch SW1 that corresponds to the sound source 2 to be reproduced. Thus, such an arrangement provides the same advantage.

Also, although it is not shown, an arrangement may be made by eliminating the sixth resistor R6 from the configuration of the first stage amplifier circuit 102 shown in FIG. 4C, which is also effective as an embodiment of the present invention. Such an arrangement provides the same advantages as those of the first stage amplifier circuit 102a shown in FIG. 4A.

[Third Embodiment]

Figure 5A:
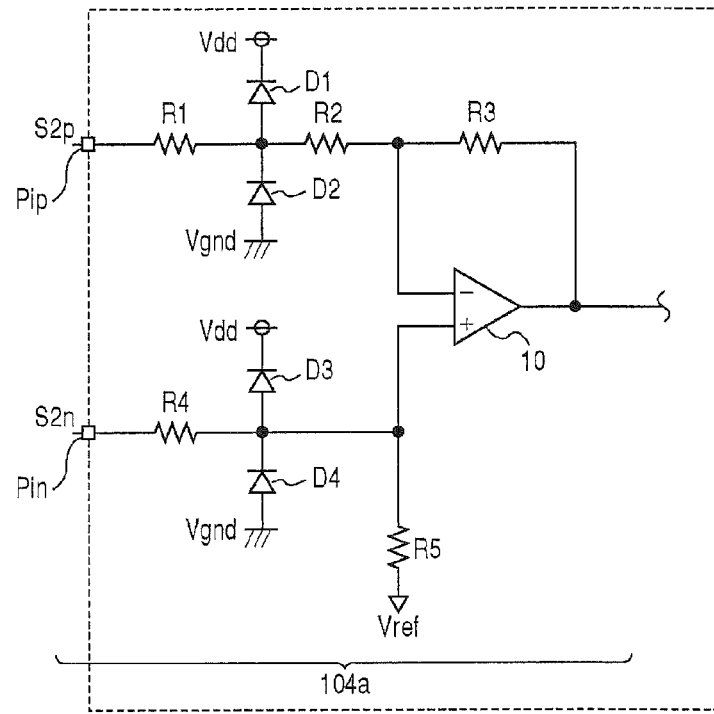
FIGS. 5A and 5B are circuit diagrams each showing a configuration of a first stage amplifier circuit according to a third embodiment.
Figure 5B:
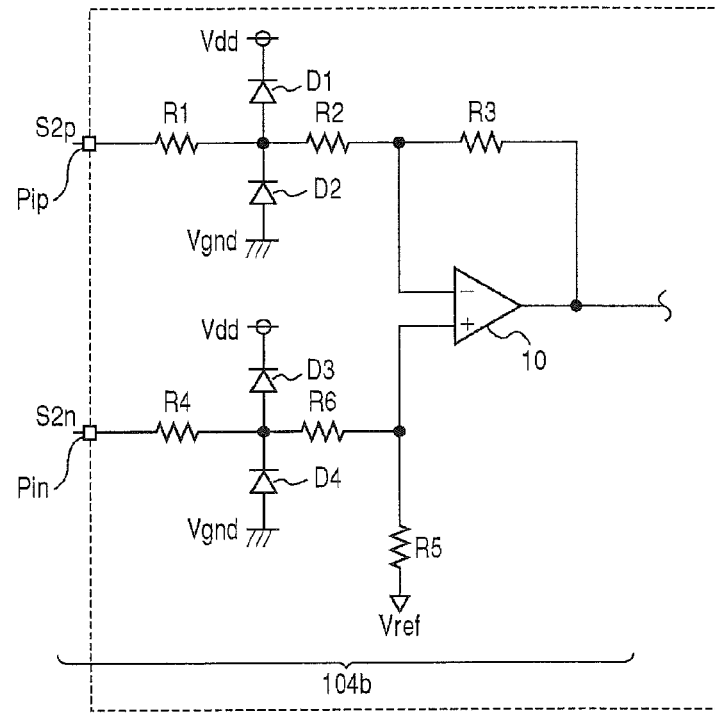

FIGS. 5A and 5B are circuit diagrams showing the configurations of first stage amplifier circuits 104a and 104b according to a third embodiment.

The first stage amplifier circuit 104a and the first stage amplifier circuit 104b each amplify a differential input signal S2p/S2n. The first stage amplifier circuit 104a has a configuration obtained by combining the configurations of the first stage amplifier circuit 100a shown in FIG. 1A and the first stage amplifier circuit 102a shown in FIG. 4A. The first stage amplifier circuit 104b has a configuration obtained by combining the configurations of the first stage amplifier circuit 100a shown in FIG. 1A and the first stage amplifier circuit 102b shown in FIG. 4B.

With the first stage amplifier circuit 104a or the first stage amplifier circuit 104b, such a differential input signal S2p/S2n can be subjected to differential amplification. Furthermore, by adjusting the resistance of each resistor, such an arrangement allows the input voltage range to be adjusted with respect to the differential input signal S2p/S2n.

Also, an arrangement may be made including multiple first stage amplifier circuits 104a shown in FIG. 4A or multiple first stage amplifier circuits 104b shown in FIG. 4B for every sound source, and configured such that, by means of a selector, one of the multiple first stage amplifier circuits can be selected. Such an arrangement is effective as an embodiment of the present invention.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

With each embodiment described above, the first resistor R1 through sixth resistor R6 may each be configured as a variable resistor. With such an arrangement in which at least one of the first resistor R1 through sixth resistor R6 is configured as a variable resistor, the input voltage range or the gain can be changed and adjusted according to an input signal.

Description has been made in the embodiments as an example regarding a circuit for processing an audio signal. However, the present invention is not restricted to such an arrangement. Also, the present invention can be applied to a first stage amplifier circuit of a circuit for processing any desired signal.

Description has been made in the embodiment regarding a first stage amplifier circuit 104 configured to receive a single power supply voltage, i.e., to employ the power supply voltage Vdd and the ground terminal Vgnd. However, the present invention is not restricted to such an arrangement. Also, the present invention can be applied to a first stage amplifier circuit 104 configured to receive dual power supply voltages, i.e., to employ a positive power supply voltage Vdd and a negative power supply voltage Vss.

FIGS. 6A and 6B are circuit diagrams respectively showing modifications of the first stage amplifier circuits shown in FIGS. 1A and 1B. The first stage amplifier circuits shown in FIGS. 6A and 6B each further include a fifth diode D5 and a sixth diode D6 in addition to the configurations shown in FIGS. 1A and 1B. The fifth diode D5 is arranged in parallel with the first resistor R1 in a first direction. The sixth diode D6 is arranged in parallel with the first resistor R1 in the opposite direction to that of the fifth diode D5.

With such a modification, if a voltage that is higher than the power supply voltage Vdd is applied to the input terminal Pi, a current flows through a path that connects the terminal Pi, the diode D6, the diode D1, and the power supply terminal Vdd. Thus, such an arrangement is capable of clamping the electric potential at the input terminal Pi to Vdd+2×Vf, thereby protecting the internal circuit.

Furthermore, if a voltage that is lower than the ground voltage Vgnd is applied to the input terminal Pi, a current flows through a path that connects the ground terminal, the second diode D2, the fifth diode D5, and the input terminal Pi. Thus, such an arrangement is capable of clamping the electric potential at the input terminal Pi to −2×Vf, thereby protecting the internal circuit.

Figure 7A:
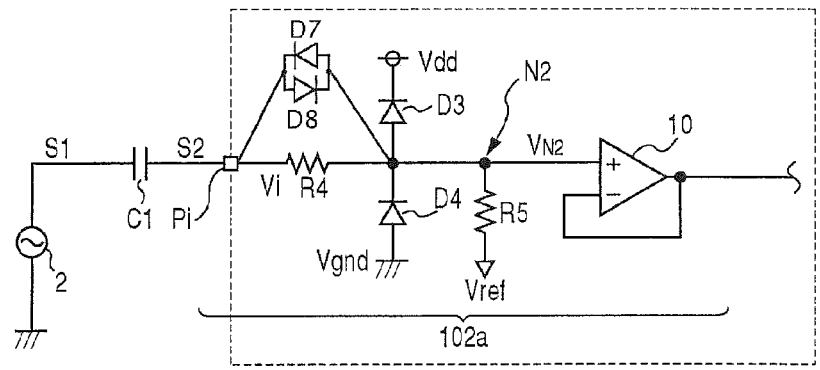
FIG. 7A through 7C are circuit diagrams showing modifications of the first stage amplifier circuits shown in FIG. 4A through FIG. 4C.
Figure 7B:
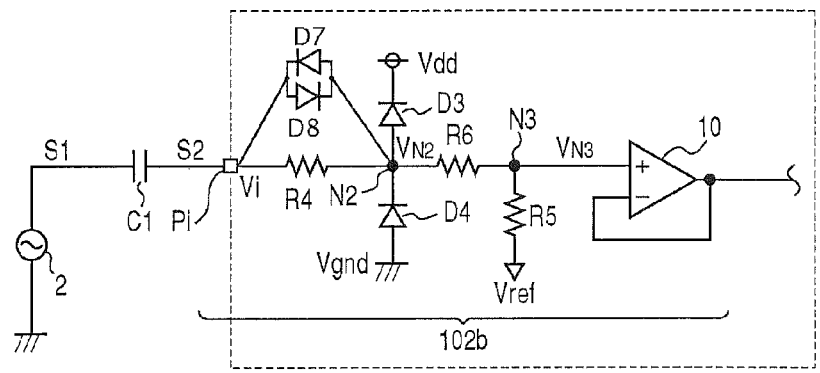
Figure 7C:
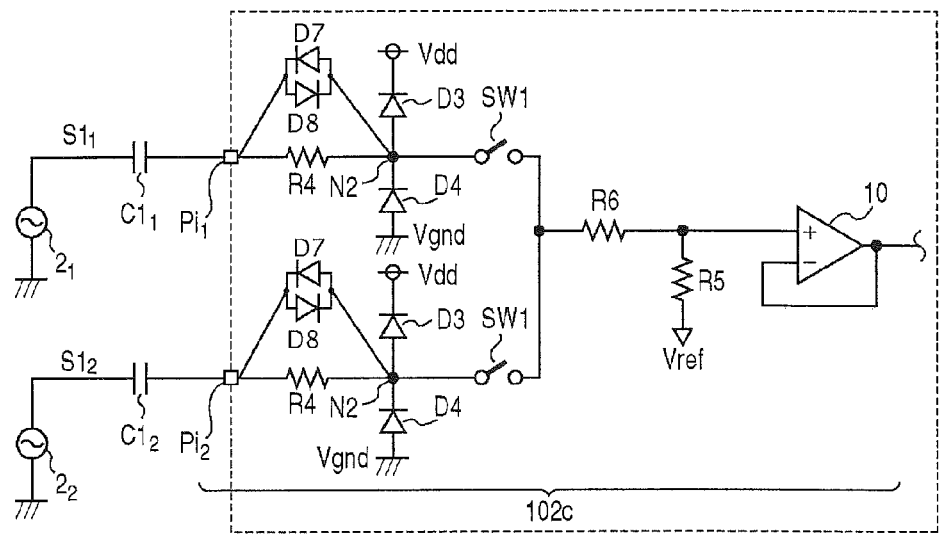

FIG. 7A through FIG. 7C are circuit diagrams respectively showing modifications of the first stage amplifier circuits shown in FIG. 4A through FIG. 4C.

The first stage amplifier circuits shown in FIG. 7A through FIG. 7C each further include a seventh diode D7 and an eighth diode D8, in addition to the configurations shown in FIG. 4A through FIG. 4C. The seventh diode D7 is arranged in parallel with the fourth resistor R4 in a first direction. The eighth diode D8 is arranged in parallel with the fourth resistor R4 in the opposite direction to that of the seventh diode D7.

With such modifications, if a voltage that is higher than the power supply voltage Vdd is applied to the input terminal Pi, a current flows through a path that connects the terminal Pi, the diode D8, the diode D3, and the power supply terminal Vdd. Thus, such an arrangement is capable of clamping the electric potential at the input terminal Pi to Vdd+2×Vf, thereby protecting the internal circuit.

Furthermore, if a voltage that is lower than the ground voltage Vgnd is applied to the input terminal Pi, a current flows through a path that connects the ground terminal Vgnd, the fourth diode D4, the seventh diode D7, and the input terminal Pi. Thus, such an arrangement is capable of clamping the electric potential at the input terminal Pi to −2×Vf, thereby protecting the internal circuit.

Figure 8A:
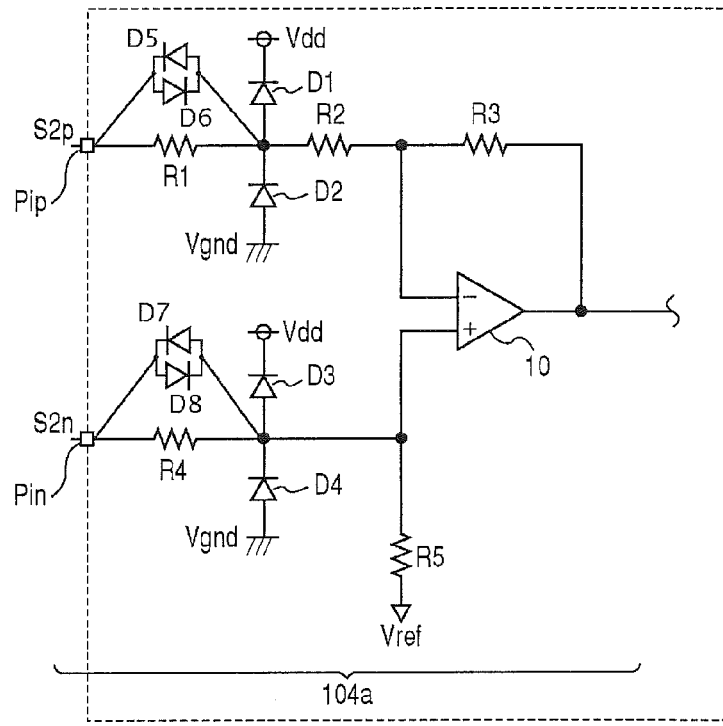
FIGS. 8A and 8B are circuit diagrams showing modifications of the first stage amplifier circuits shown in FIGS. 5A and 5B.
Figure 8B:
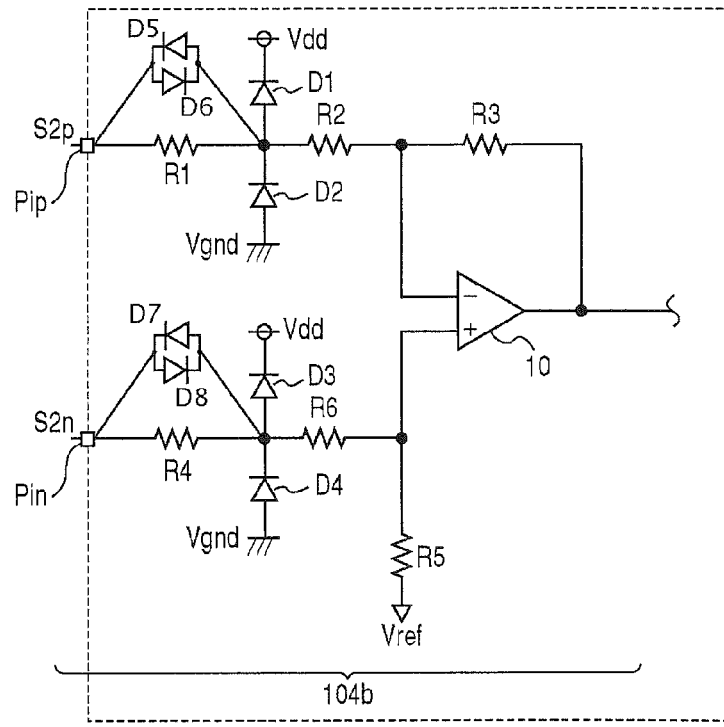

FIGS. 8A and 8B are circuit diagrams respectively showing modifications of the first stage amplifier circuits shown in FIGS. 5A and 4B.

The first stage amplifier circuits shown in FIGS. 8A and 8B each further include a fifth diode D5 through an eighth diode D8 in addition to the configuration shown in FIG. 5A or FIG. 5B. The fifth diode D5 is arranged in parallel with the first resistor R1 in a first direction. The sixth diode D6 is arranged in parallel with the first resistor R1 in the opposite direction to that of the fifth diode D5. The seventh diode D7 is arranged in parallel with the fourth resistor R4 in the first direction. The eighth diode D8 is arranged in parallel with the fourth resistor R4 in the opposite direction to that of the seventh diode D7.

With such modifications, if a voltage that is higher than the power supply voltage Vdd is applied to the input terminal Pip, a current flows through a path that connects the terminal Pip, the diode D6, the diode D1, and the power supply terminal Vdd. Thus, such an arrangement is capable of clamping the voltage at the input terminal Pip to Vdd+2×Vf, thereby protecting the internal circuit.

Furthermore, if a voltage that is lower than the ground voltage Vgnd is applied to the input terminal Pip, a current flows through a path that connects the ground terminal, the second diode D2, the fifth diode D5, and the input terminal Pip. Thus, such an arrangement is capable of clamping the electric potential at the input terminal Pip to −2×Vf, thereby protecting the internal circuit.

Moreover, if a voltage that is higher than the power supply voltage Vdd is applied to the input terminal Pin, a current flows through a path that connects the terminal Pin, the diode D8, the diode D3, and the power supply terminal Vdd. Thus, such an arrangement is capable of clamping the voltage at the input terminal Pin to Vdd+2×Vf, thereby protecting the internal circuit.

Moreover, if a voltage that is lower than the ground voltage Vgnd is applied to the input terminal Pin, a current flows through a path that connects the ground terminal Vgnd, the fourth diode D4, the seventh diode D7, and the input terminal Pin. Thus, such an arrangement is capable of clamping the electric potential at the input terminal Pin to −2×Vf, thereby protecting the internal circuit.

While the preferred embodiments of the present invention have been described using specific terms, such description is for illustrative purposes only, and it is to be understood that changes and variations may be made without departing from the spirit or scope of the appended claims.

What is claimed is:

1. A first stage amplifier circuit comprising:
an input terminal configured to receive an input signal from an external circuit;
a first resistor arranged such that a first terminal thereof is connected to the input terminal;
a second resistor arranged such that a first terminal thereof is connected to a second terminal of the first resistor;
an operational amplifier arranged such that an inverting input terminal thereof is connected to a second terminal of the second resistor, and a reference voltage is applied to a non-inverting input terminal thereof;
a third resistor arranged between an output terminal of the operational amplifier and the inverting input terminal of the operational amplifier;
a first diode arranged between the second terminal of the first resistor and a first fixed voltage terminal such that a cathode thereof is on the first fixed voltage terminal side; and
a second diode arranged between the second terminal of the first resistor and a second fixed voltage terminal such that a cathode thereof is on the second terminal side of the first resistor,
wherein the aforementioned components are integrated on a single semiconductor substrate, and wherein
an input voltage range of the first stage amplifier circuit is adjustable according to a division ratio provided by the first resistor and the second resistor.

2. A first stage amplifier circuit comprising:
a plurality of input terminals, each configured to receive an input signal from an external circuit;
a plurality of first resistors respectively arranged for each of the plurality of input terminals, and each arranged such that a first terminal thereof is connected to a corresponding input terminal;
a plurality of second resistors respectively arranged for each of the plurality of input terminals, and each arranged such that a first terminal thereof is connected to a second terminal of a corresponding first resistor;
a plurality of switches respectively arranged for each of the plurality of input terminals, and each arranged such that a first terminal thereof is connected to a second terminal of a corresponding second resistor;
an operational amplifier arranged such that an inverting input terminal thereof is connected to second terminals of the plurality of switches, and a reference voltage is applied to a non-inverting input terminal thereof;
a third resistor arranged between an output terminal of the operational amplifier and the inverting input terminal of the operational amplifier;
a plurality of first diodes respectively arranged for each of the plurality of input terminals, and each arranged between the second terminal of a corresponding first resistor and a first fixed voltage terminal such that a cathode thereof is on the first fixed voltage terminal side; and a plurality of second diodes respectively arranged for each of the plurality of input terminals, and each arranged between the second terminal of the first resistor and a second fixed voltage terminal such that a cathode thereof is on the second terminal side of the first resistor, wherein the aforementioned components are integrated on a single semiconductor substrate.

3. A first stage amplifier circuit comprising:

an input terminal configured to receive an input signal from an external circuit;

a fourth resistor arranged such that a first terminal thereof is connected to the input terminal;

a fifth resistor arranged such that a first terminal thereof is connected to a second terminal of the fourth resistor, and a reference voltage is applied to a second terminal thereof;

an operational amplifier arranged such that a non-inverting input terminal thereof is connected to the first terminal of the fifth resistor, and an inverting input terminal thereof is connected to an output terminal thereof;

a third diode arranged between the second terminal of the fourth resistor and a first fixed voltage terminal such that a cathode thereof is on the first fixed voltage terminal side; and a fourth diode arranged between the second terminal of the fourth resistor and a second fixed voltage terminal such that a cathode thereof is on the second terminal side of the fourth resistor, wherein the aforementioned components are integrated on a single semiconductor substrate, and wherein an input voltage range of the first stage amplifier circuit is adjustable according to a division ratio provided by the fourth resistor and the fifth resistor.

4. A first stage amplifier circuit according to claim 3, further comprising a sixth resistor arranged between the second terminal of the fourth resistor and the first terminal of the fifth resistor, wherein the aforementioned components are integrated on a single semiconductor substrate.

5. A first stage amplifier circuit comprising:

a plurality of input terminals, each configured to receive an input signal from an external circuit;

a plurality of fourth resistors, respectively arranged for each of the plurality of input terminals, and each arranged such that a first terminal thereof is connected to the corresponding input terminal;

a plurality of switches respectively arranged for each of the plurality of input terminals such that a first terminal of each switch is connected to a second terminal of a corresponding one of the fourth resistors, and second terminals of the switches are connected together such that they form a common second terminal;

a fifth resistor arranged such that a first terminal thereof is connected to the common second terminal connected to the plurality of switches;

an operational amplifier arranged such that a non-inverting input terminal thereof is connected to the first terminal of the fifth resistor, and an inverting input terminal thereof is connected to an output terminal thereof;

a plurality of third diodes respectively provided for each of the plurality of input terminals, and each arranged between the second terminal of a corresponding one of the fourth resistors and a first fixed voltage terminal such that a cathode thereof is on the first fixed voltage terminal side; and a plurality of fourth diodes respectively provided for each of the plurality of input terminals, and each arranged between the second terminal of a corresponding one of the fourth resistors and a second fixed voltage terminal such that a cathode thereof is on the second terminal side of the fourth resistor, wherein the aforementioned components are integrated on a single semiconductor substrate.

6. A first stage amplifier circuit according to claim 5, further comprising a sixth resistor arranged between the common second terminal thus formed by connecting together the second terminals of the plurality of switches and the first terminal of the fifth resistor, wherein the aforementioned components are integrated on a single semiconductor substrate.

7. A first stage amplifier circuit comprising:

a first input terminal configured to receive, as an input signal, one side of a differential signal received from an external circuit;

a second input terminal configured to receive, as an input signal, the other side of the differential signal received from the external circuit;

a first resistor arranged such that a first terminal thereof is connected to the first input terminal;

a second resistor arranged such that a first terminal thereof is connected to a second terminal of the first resistor;

an operational amplifier arranged such that an inverting input terminal thereof is connected to a second terminal of the second resistor;

a third resistor arranged between an output terminal of the operational amplifier and the inverting input terminal of the operational amplifier;

a fourth resistor arranged such that a first terminal thereof is connected to the second input terminal;

a fifth resistor arranged such that a first terminal thereof is connected to a second terminal of the fourth resistor and a non-inverting input terminal of the operational amplifier, and a reference voltage is applied to a second terminal thereof;

a first diode arranged between the second terminal of the first resistor and a first fixed voltage terminal such that a cathode thereof is on the first fixed voltage terminal side;

a second diode arranged between the second terminal of the first resistor and a second fixed voltage terminal such that a cathode thereof is on the second terminal side of the first resistor;

a third diode arranged between the second terminal of the fourth resistor and the first fixed voltage terminal such that a cathode thereof is on the first fixed voltage terminal side; and a fourth diode arranged between the second terminal of the fourth resistor and the second fixed voltage terminal such that a cathode thereof is on the second terminal side of the fourth resistor, wherein the aforementioned components are integrated on a single semiconductor substrate.

8. A first stage amplifier circuit according to claim 7, further comprising a sixth resistor arranged between the second terminal of the fourth resistor and the first terminal of the fifth resistor, wherein the aforementioned components are integrated on a single semiconductor substrate.

9. A first stage amplifier circuit according to claim 1, further comprising a fifth diode arranged in parallel with the first resistor in a first direction; and a sixth diode arranged in parallel with the first resistor in a second direction that is opposite to the first direction.

10. A first stage amplifier circuit according to claim 2, further comprising a fifth diode arranged in parallel with the first resistor in a first direction; and
    a sixth diode arranged in parallel with the first resistor in a second direction that is opposite to the first direction.

11. A first stage amplifier circuit according to claim 3, further comprising a seventh diode arranged in parallel with the fourth resistor in a first direction; and
    an eighth diode arranged in parallel with the fourth resistor in a second direction that is opposite to the first direction.

12. A first stage amplifier circuit according to claim 5, further comprising a seventh diode arranged in parallel with the fourth resistor in a first direction; and
    an eighth diode arranged in parallel with the fourth resistor in a second direction that is opposite to the first direction.

13. A first stage amplifier circuit according to claim 7, further comprising a fifth diode arranged in parallel with the first resistor in a first direction;
    a sixth diode arranged in parallel with the first resistor in a second direction that is opposite to the first direction;
    a seventh diode arranged in parallel with the fourth resistor in a first direction; and
    an eighth diode arranged in parallel with the fourth resistor in a second direction that is opposite to the first direction.

14. An electronic device comprising:
a sound source configured to generate an audio signal;
a capacitor arranged on a path of the audio signal;
a first stage amplifier circuit according to claim 1, configured to amplify the audio signal input via the capacitor; and
an audio output unit configured to output the audio signal amplified by the first stage amplifier circuit.

15. An electronic device comprising:
a sound source configured to generate an audio signal;
a capacitor arranged on a path of the audio signal;
a first stage amplifier circuit according to claim 2, configured to amplify the audio signal input via the capacitor; and
an audio output unit configured to output the audio signal amplified by the first stage amplifier circuit.

16. An electronic device comprising:
a sound source configured to generate an audio signal;
a capacitor arranged on a path of the audio signal;
a first stage amplifier circuit according to claim 3, configured to amplify the audio signal input via the capacitor; and
an audio output unit configured to output the audio signal amplified by the first stage amplifier circuit.

17. An electronic device comprising:
a sound source configured to generate an audio signal;
a capacitor arranged on a path of the audio signal;
a first stage amplifier circuit according to claim 5, configured to amplify the audio signal input via the capacitor; and
an audio output unit configured to output the audio signal amplified by the first stage amplifier circuit.

18. An electronic device comprising:
a sound source configured to generate an audio signal;
a capacitor arranged on a path of the audio signal;
a first stage amplifier circuit according to claim 7, configured to amplify the audio signal input via the capacitor; and
an audio output unit configured to output the audio signal amplified by the first stage amplifier circuit.

\* \* \* \* \*